United States Patent
Jung

(10) Patent No.: US 8,264,267 B2
(45) Date of Patent: Sep. 11, 2012

(54) CLOCK PULSE GENERATING CIRCUIT

(75) Inventor: Hun Sam Jung, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 329 days.

(21) Appl. No.: 12/655,355

(22) Filed: Dec. 29, 2009

(65) Prior Publication Data

US 2010/0109737 A1    May 6, 2010

Related U.S. Application Data

(62) Division of application No. 12/005,511, filed on Dec. 27, 2007, now Pat. No. 7,667,516.

(30) Foreign Application Priority Data

Aug. 23, 2007   (KR) .................. 10-2007-0085153

(51) Int. Cl.
   *H03K 3/00*   (2006.01)
(52) U.S. Cl. ........................ 327/291; 327/294
(58) Field of Classification Search .................. 327/291, 327/293, 294
   See application file for complete search history.

(56) References Cited

U.S. PATENT DOCUMENTS

| | | | |
|---|---|---|---|
| 5,818,276 A | 10/1998 | Garrity et al. | |
| 6,285,226 B1 | 9/2001 | Nguyen | |
| 6,781,431 B2 | 8/2004 | Taito et al. | |
| 6,798,248 B2 | 9/2004 | Hazucha et al. | |
| 7,081,784 B2 * | 7/2006 | Kang | 327/291 |
| 7,088,155 B2 | 8/2006 | Takahashi | |
| 7,126,396 B1 | 10/2006 | Courcy | |
| 7,417,479 B2 * | 8/2008 | Kitayama | 327/175 |
| 7,474,136 B2 * | 1/2009 | Heightley | 327/175 |
| 7,667,516 B2 * | 2/2010 | Jung | 327/291 |

FOREIGN PATENT DOCUMENTS

| | | |
|---|---|---|
| KR | 10-2003-0002434 A | 1/2003 |
| KR | 10-2007-0031599 A | 3/2007 |
| KR | 10-2007-0056662 A | 6/2007 |

OTHER PUBLICATIONS

Office Action issued Feb. 9, 2009 in connection with U.S. Appl. No. 12/005,511, filed Dec. 27, 2007.
Office Action issued May 11, 2009 in connection with U.S. Appl. No. 12/005,511, filed Dec. 27, 2007.
Notice of Allowance issued Oct. 1, 2009 in connection with U.S. Appl. No. 12/005,511, filed Dec. 27, 2007.

\* cited by examiner

*Primary Examiner* — Hai L Nguyen
(74) *Attorney, Agent, or Firm* — John P. White; Cooper & Dunham LLP

(57) ABSTRACT

A clock pulse generating circuit includes a pulse generator, a clock regulator, and a pre-driver. The pulse generator is configured to vary pulse widths of a rising clock signal and a falling clock signal. The clock regulator is configured to regulate output signals of the pulse generator to prevent an overlap and a duty drop of the output signals of the pulse generator. The pre-driver is configured to output data driving signals according to output signals of the clock regulator.

12 Claims, 11 Drawing Sheets

CLOCK PULSE GENERATING CIRCUIT

This application is a divisional of U.S. Ser. No. 12/005,511, filed Dec. 27, 2007, now U.S. Pat. No. 7,667,516, which issued on Feb. 23, 2010, and claims priority of Korean Patent Application No. 10-2007-0085153, filed Aug. 23, 2007, the contents of which are hereby incorporated by reference into this application.

BACKGROUND

The present disclosure relates to a semiconductor memory device, and more particularly, to a clock pulse generating circuit.

After performing a read operation, double data rate synchronous dynamic random access memory (DDR SDRAM) outputs a DQ strobe signal and a DQ data signal to a DQS pin and a DQ pin, respectively, under a predetermined timing condition associated with a system clock. The timing condition is that toggle points of the DQ strobe signal and the DQ data signal output from the DDR SDRAM should be concurrent with that of the external system clock, or a time difference therebetween, if any, should be within a predetermined range.

The timing condition can be satisfied with the help of an internal delay locked loop (DLL) of a DRAM, which is configured to generate a DLL clock imitating the external system clock. A rising clock signal RCLKDLL and a falling clock signal FCLKDLL, which imitate a rising and a falling of the clock, respectively, are important factors in determining tAC and tDQSCK.

A skew may be generated between the signals RCLKDLL and FCLKDLL depending on routing rules and operation conditions. Thus deterioration of the characteristics such as tAC and tDQSCK may be caused depending on a circuit type of a DQ driver which receives the signals RCKDLL and FCKDLL.

FIG. 1 illustrates a block diagram of a conventional circuit for generating a DQ data driving signal.

Referring to FIG. 1, signals RCLKDLL and FCLKDLL are output from a DLL 300 to be input into pre-drivers 200 of a respective DQ after passing through a pulse generator 100.

Cycles of the signals RCLKDLL and FCLKDLL are 1×tCK and time intervals for maintaining each logic level state thereof are ½×tCK.

Time intervals for maintaining each logic level state of the signals RCLKDO and FCLKDO output from the pulse generator 100 are tPW, whereas cycles thereof are the same as those of the signals RCLKDLL and FCLKDLL.

FIG. 2 illustrates a circuit diagram of a conventional pulse generator.

Referring to FIG. 2, a pulse generator 100 receives the signals RCLKDLL and FCLKDLL and reduces pulse widths thereof to output signals RCLKDO and FCLKDO. For example, when cycles and time intervals for maintaining each logic level state of the signals RCLKDLL and FCLKDLL are 1×tCK and ½×tCK, respectively, those of the signals RCLKDO and FCLKDO are 1*tCK and tPW, respectively. The time tPW is determined by a signal of node A and a signal of node B, the signal of node B being generated by delaying and inverting the received signals RCLKDLL and FCLKDLL.

FIG. 3 illustrates an operation waveform generated by the conventional pulse generator of FIG. 2, when a low frequency signal is input. FIG. 4 illustrates an operation waveform generated by the conventional pulse generator of FIG. 2, when a high frequency signal is input.

Referring to FIGS. 3 and 4, the pulse generator generates pulse signals RCLKDO and FCLKDO having pulse widths of tPW. However, it is not true when the frequencies of the input signals RCLKDLL and FCLKDLL are high, i.e., when ½× tCK is smaller than tPW. Instead, in such case, output signals from the pulse generator have cycles of 1*tCK and pulse widths of ½*tCK which is smaller than tPW.

In other words, when frequencies of the input signals are higher than a predetermined frequency, the pulse generator generates a level-type signal, not a pulse.

FIG. 5 illustrates a circuit diagram of a conventional pre-driver. A pre-driver 200 assigned to each DQ has a circuit for synchronizing a data signal with signals RCLKDO and FCLKDO and outputting the synchronized data signal to the DQ driver.

In general, the pre-driver may show a stable operation when signals RCLKDO and FCLKDO generated by low frequency signals (signals having ½×tCK greater than tPW) are input thereinto. That is, the signals RCLKDO and FCLKDO do not have overlap regions where both of them have logic high levels at a same time when a data signals is transferred. Accordingly, the pre-driver may easily distinguish the rising clock and the falling clock.

However, when the input signals are of high frequencies, i.e., when the input signals have ½*tCK smaller than tPW, the pulse generator may not generate signals RCLKDO and FCLKDO having pulse widths of tPW. Level-type signals having logic high levels for time intervals of ½×tCK are generated, instead. Such signals may be overlapped in the pre-driver.

Granting that overlap regions are not generated, a turn-on region may be generated at regions where the logic levels of the signals changes from logic high level to logic low level or from logic low level to logic high level.

Accordingly, during the synchronization of a data signal with signals RCLKDO and FCLKDO in a pre-driver, deterioration of characteristics may be caused for as long time as the overlap regions of a logic high level. Characteristics such as tAC and tDQSCK may also be deteriorated in a DQ driver.

BRIEF SUMMARY

Various exemplary embodiments (infra) of the present disclosure are directed to a clock pulse generating circuit which can prevent clock pulse signals, which data signals will be synchronized with, from overlapping each other.

In addition, a clock pulse generating circuit, in some exemplary embodiments, can stabilize the supply of clock pulses even if a skew is generated and prevent deteriorations of characteristics such as tAC and tDQSCK.

In an aspect of this disclosure, a clock pulse generating circuit includes a pulse generator configured to vary pulse widths of a rising clock signal and a falling clock signal, a clock regulator configured to regulate output signals of the pulse generator to prevent an overlap and a duty drop of the output signals of the pulse generator, and a pre-driver configured to output data driving signals according to output signals of the clock regulator.

In another aspect, a clock pulse generating circuit includes a clock controller configured to regulate a rising clock signal and a falling clock signal, and a pre-driver configured to output data driving signals according to output signals of the clock controller.

In still another aspect, a clock pulse generating circuit includes a data driving signal generator configured to regulate clock signals to output data driving signals, and a data controller configured to control input data signals in response to the data driving signals.

DESCRIPTION OF EXEMPLARY EMBODIMENTS

Hereinafter, a clock pulse generating circuit in accordance with examples and exemplary embodiments of the present invention will be described in detail with reference to the accompanying drawings.

Figure 1:
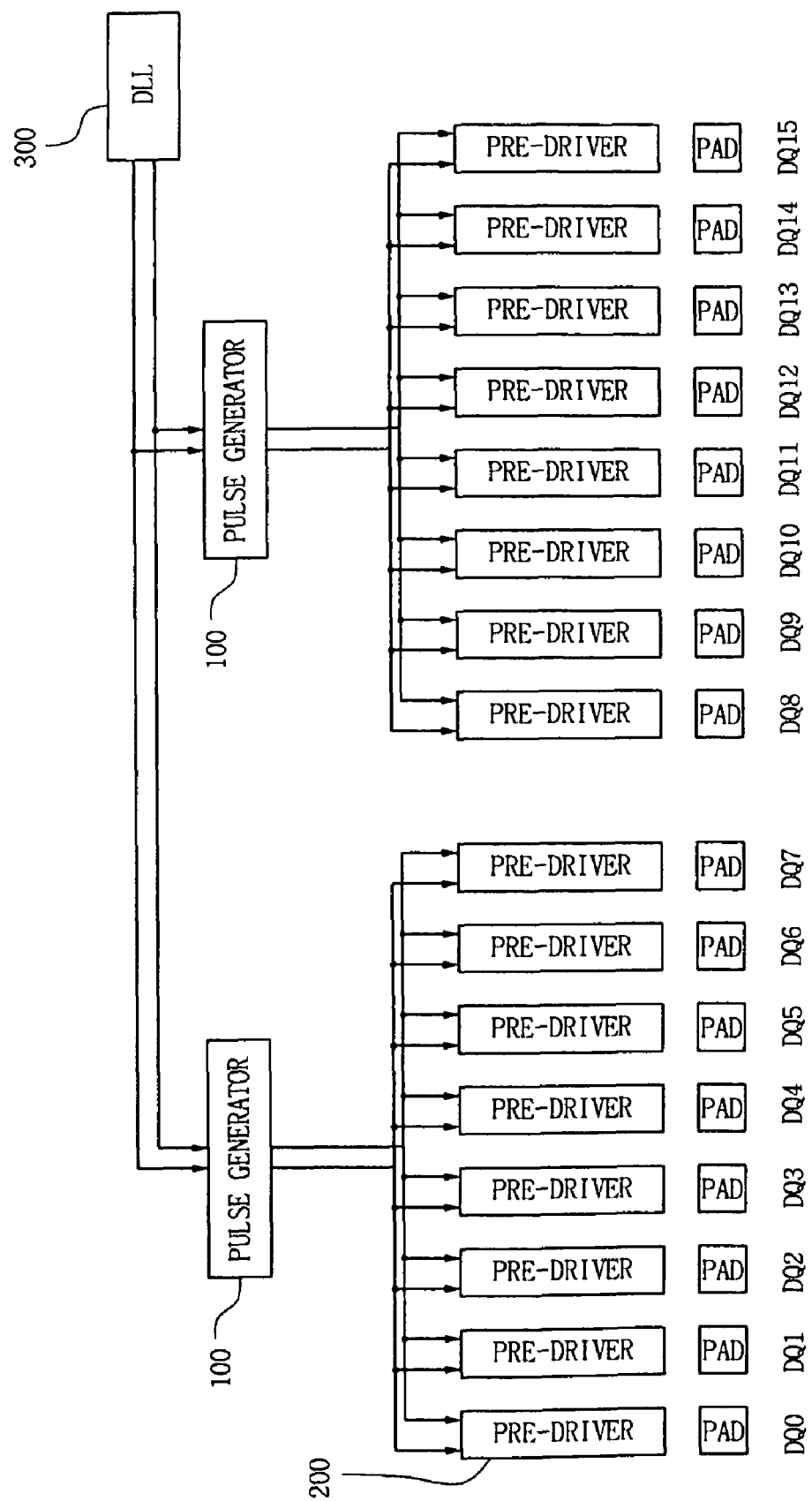
FIG. 1 illustrates a block diagram of a conventional circuit for generating a DQ data driving signal.
Figure 2:
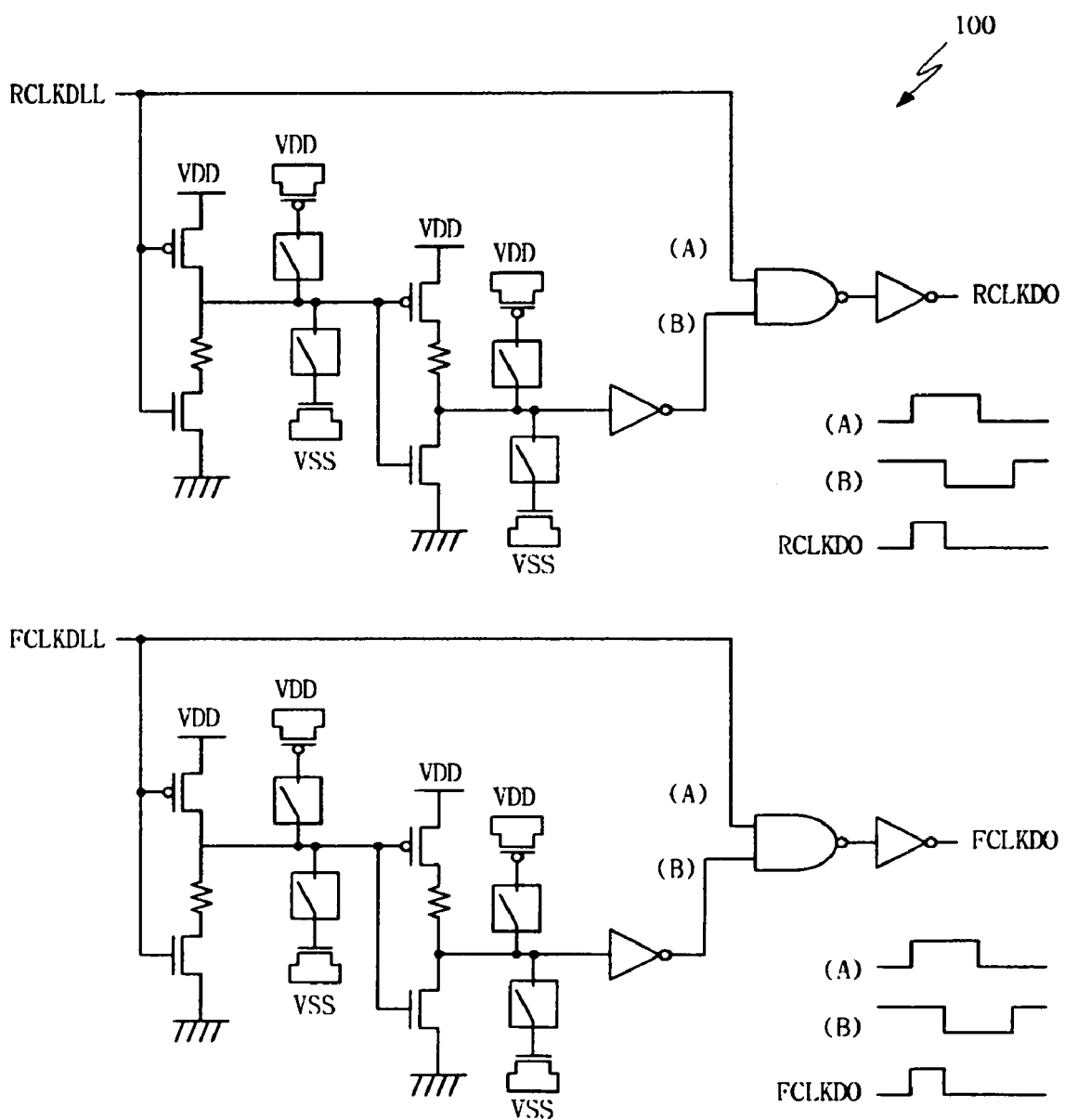
FIG. 2 illustrates a circuit diagram of a conventional pulse generator.
Figure 3:
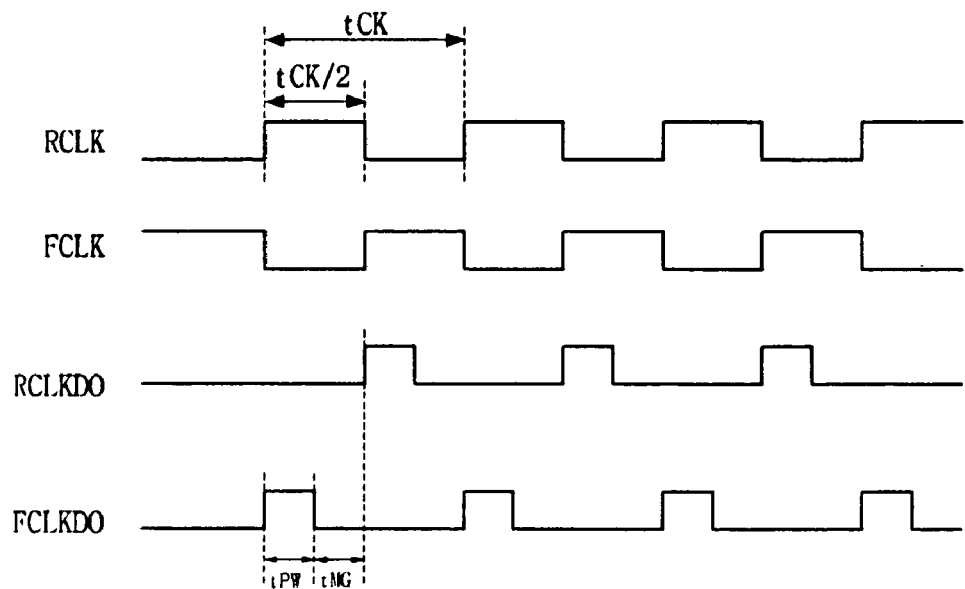
FIG. 3 illustrates an operation waveform generated by the conventional pulse generator of FIG. 2, when a low frequency signal is input.
Figure 4:
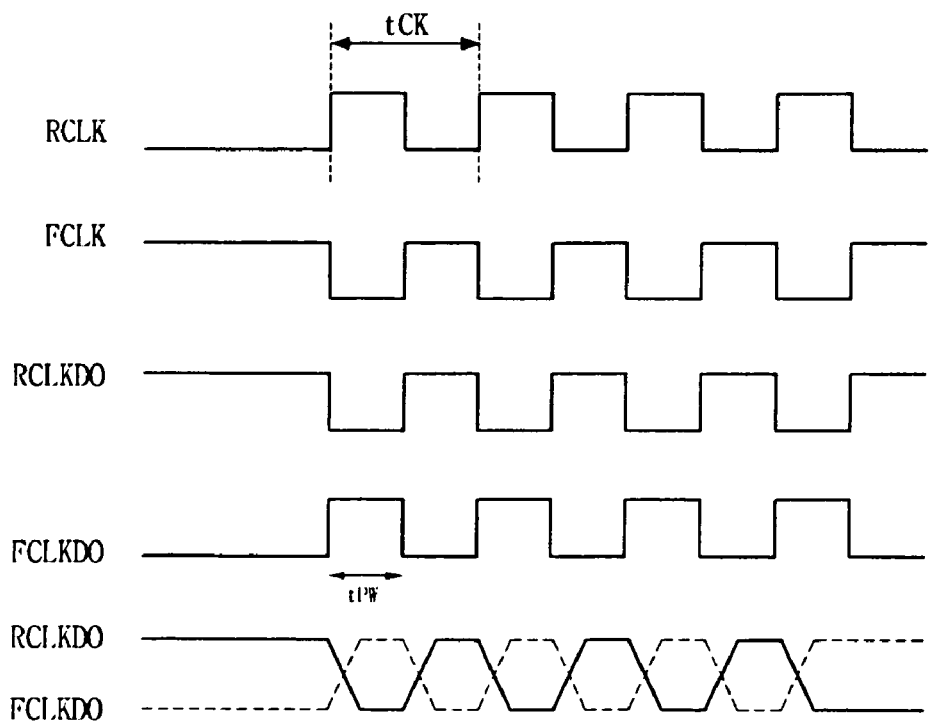
FIG. 4 illustrates an operation waveform generated by the conventional pulse generator of FIG. 2, when a high frequency signal is input.
Figure 5:
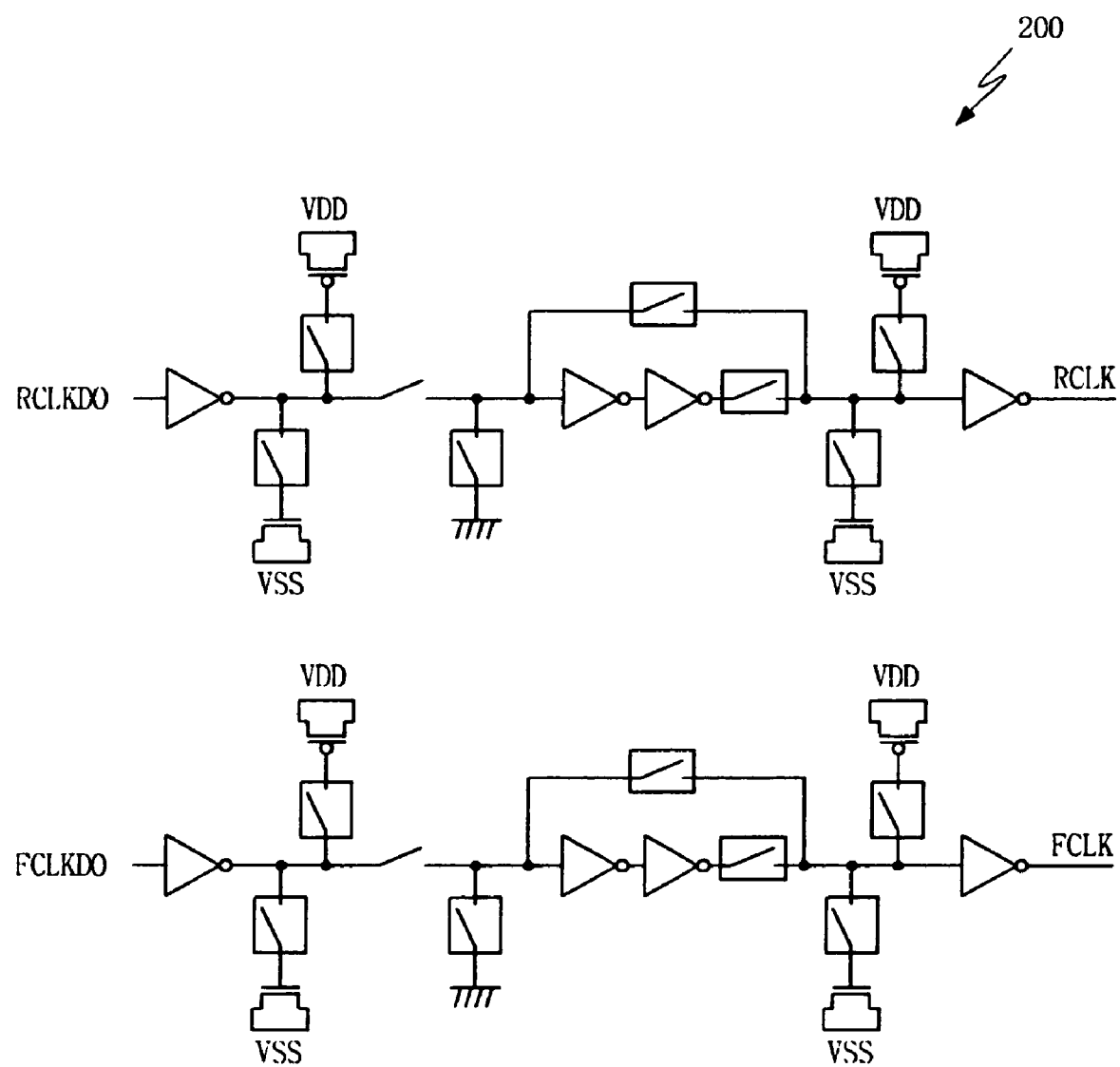
FIG. 5 illustrates a circuit diagram of a conventional pre-driver.
Figure 6:
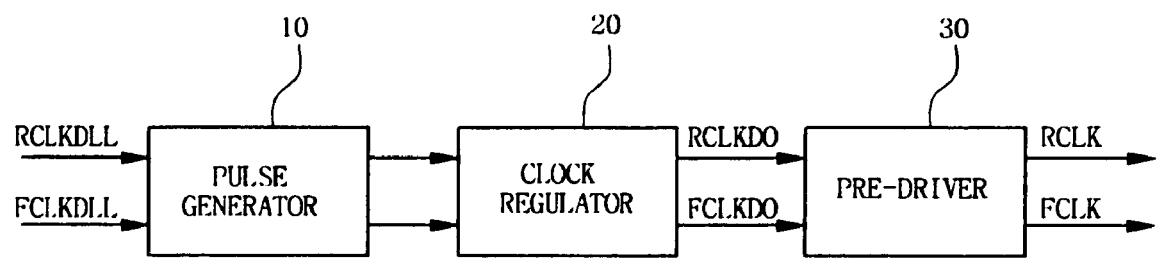
FIG. 6 illustrates a block diagram of a clock pulse generating circuit according to an exemplary embodiment of the present disclosure.
Figure 7:
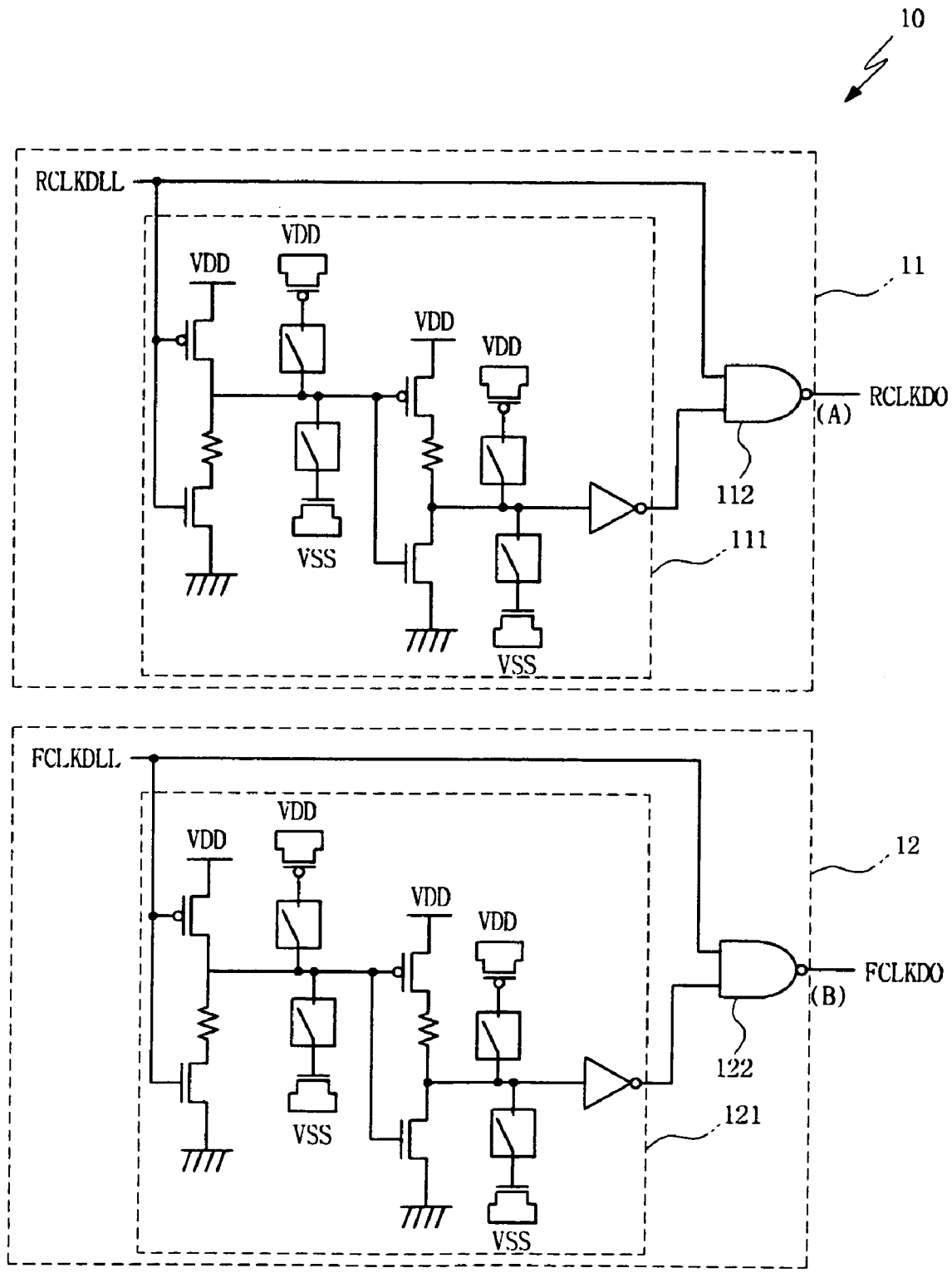
FIG. 7 illustrates a circuit diagram of a pulse generator in the clock pulse generating circuit of FIG. 6.
Figure 8:
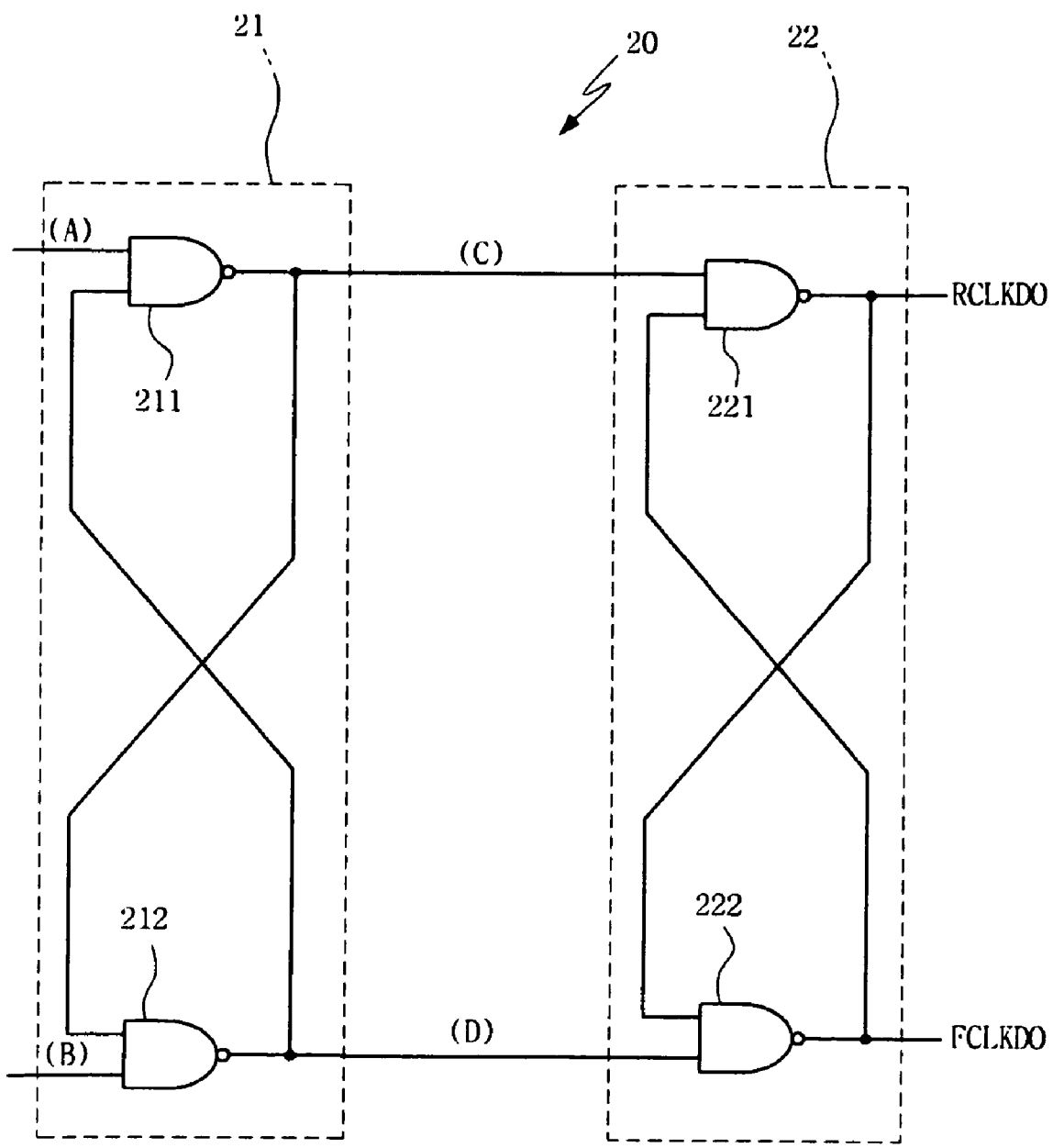
FIG. 8 illustrates a circuit diagram of a clock regulator in the clock pulse generating circuit of FIG. 6.
Figure 9:
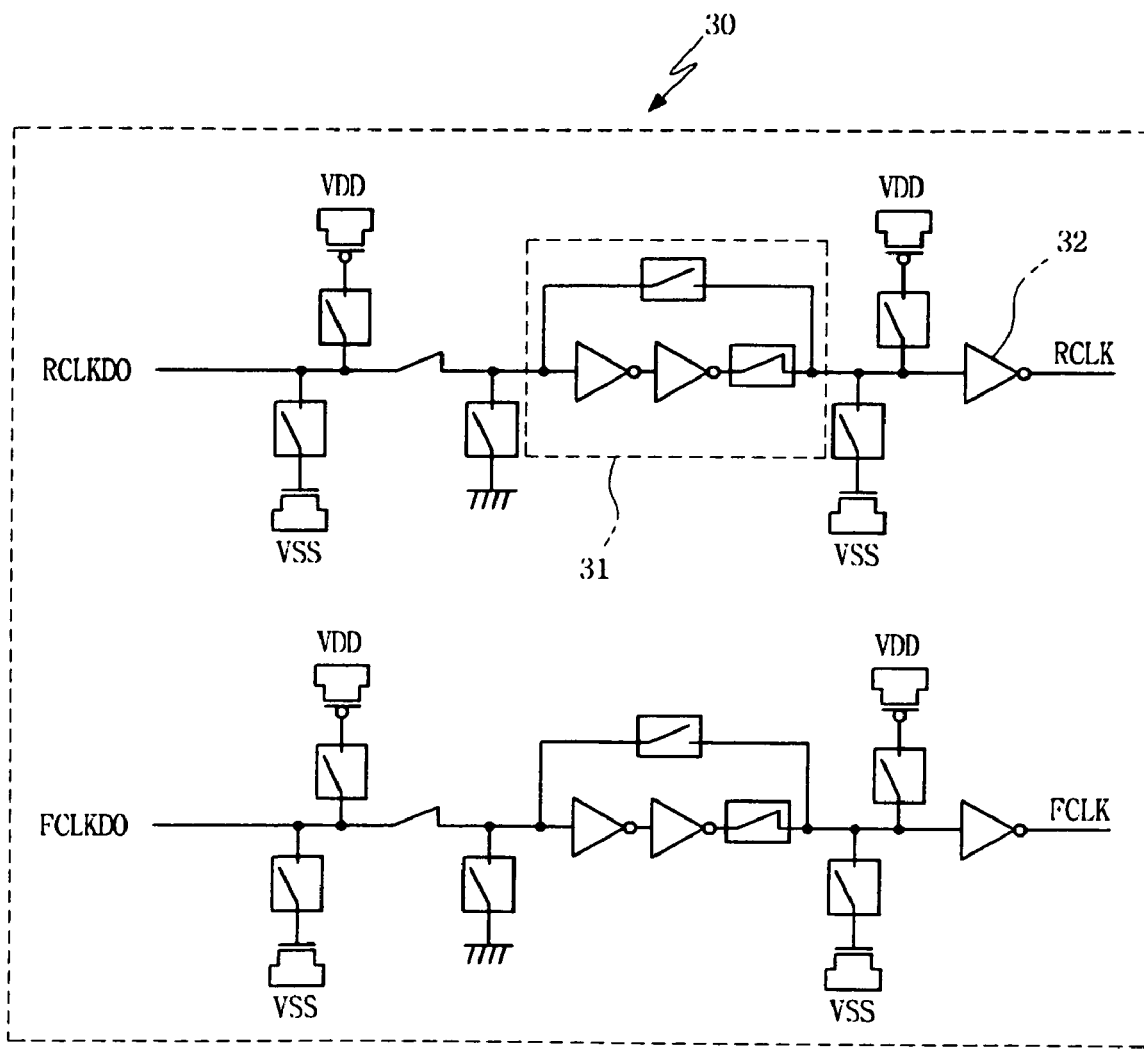
FIG. 9 illustrates a circuit diagram of a pre-driver in the clock pulse generating circuit of FIG. 6.

FIG. 6 illustrates a block diagram of a clock pulse generating circuit according to an exemplary embodiment of the present disclosure, FIG. 7 illustrates a circuit diagram of a pulse generator in the clock pulse generating circuit of FIG. 6, FIG. 8 illustrates a circuit diagram of a clock regulator in the clock pulse generating circuit of FIG. 6, and FIG. 9 illustrates a circuit diagram of a pre-driver in the clock pulse generating circuit of FIG. 6.

Referring to FIG. 6, the clock pulse generating circuit includes a pulse generator 10, a clock regulator 20 and a pre-driver 30. The pulse generator 10 is configured to vary pulse widths of a rising clock signal RCLKDLL and a falling clock signal FCLKDLL. A phase of the rising clock signal RCLKDLL is opposite to that of the falling clock signal FCLKDLL. The clock regulator 20 is configured to regulate output signals of the pulse generator 10 to prevent an overlap and a duty drop. The pre-driver 30 is configured to output data driving signals according to output signals of the clock regulator 20.

The rising clock signal RCLKDLL and the falling clock signal FCLKDLL are pulse signals generated by a DLL.

Referring to FIG. 7, the pulse generator 10 includes a first variation part 11 and a second variation part 12. The first variation part 11 is configured to vary a pulse width of the rising clock signal RCLKDLL, and the second variation part is configured to vary a pulse width of the falling clock signal FCLKDLL.

The first variation part 11 includes a first delay unit 111 and a first logic unit 112. The first delay unit 111 is configured to delay the rising clock signal RCLKDLL by a predetermined time. The first logic unit 112 is configured to perform a logic operation on the rising clock signal RCLKDLL and an output signal of the first delay unit.

The second variation part 12 includes a second delay unit 121 and a second logic unit 122. The second delay unit 121 is configured to delay the falling clock signal FCLKDLL by a predetermined time. The second logic unit 122 is configured to perform a logic operation on the falling clock signal FCLKDLL and an output signal of the second delay unit.

Referring to FIG. 8, the clock regulator 20 includes a first regulation part 21 and a second regulation part 22. The first regulation part 21 is configured to regulate a first clock signal (A node signal) and a second clock signal (B node signal), which are output from the pulse generator 10 by using an SR latch circuit. The second regulation part 22 is configured to regulate signals (C node signal and D node signal) output from the first regulation part 21 by using an SR latch circuit.

The first clock signal (A node signal) is generated by varying a pulse width of the rising clock signal RCLKDLL, and the second clock signal (B node signal) is generated by varying a pulse width of the falling clock signal FCLKDLL.

The first regulation part 21 includes a first logic unit 211 configured to perform a logic operation on the first clock signal and a second logic unit 212 configured to perform a logic operation on the second clock signal. An output signal of the first logic unit 211 is input into the second logic unit 212 and an output signal of the second logic unit 212 is input into the first logic unit 211.

The second regulation part 22 includes a third logic unit 221 configured to perform a logic operation on an output signal of the first logic unit 211 and a fourth logic unit 222 configured to perform a logic operation on an output signal of the second logic unit 212. An output signal of the third logic unit 221 is input into the fourth logic unit 222 and an output signal of the fourth logic unit 222 is input into the third logic unit 221.

Referring to FIG. 9, the pre-driver 30 includes a buffer unit 31 and an inverter unit 32. The buffer unit 31 is configured to buffer output signals of the clock regulator, and the inverter 32 is configured to invert output signals of the buffer 31.

Figure 11:
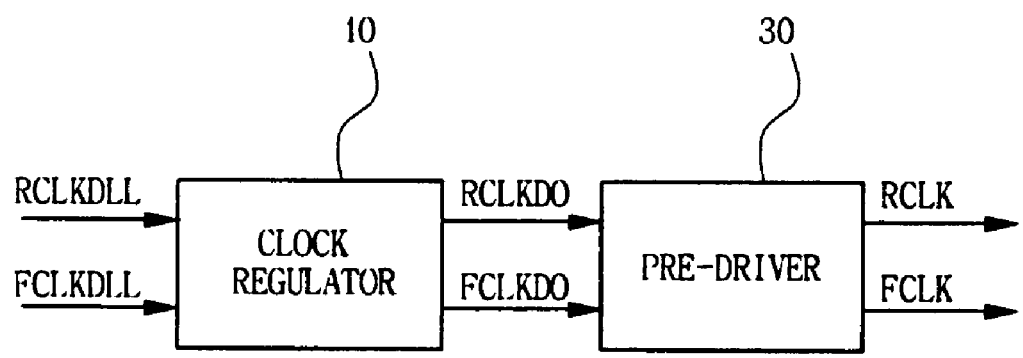
FIG. 11 illustrates a block diagram of a clock pulse generating circuit according to another exemplary embodiment of the present disclosure.

FIG. 11 illustrates a block diagram of a clock pulse generating circuit according to another exemplary embodiment of the present disclosure.

Referring to FIG. 11, the clock pulse generating circuit includes a clock controller 40 and a pre-driver 30. The clock controller 40 is configured to regulate a rising clock signal RCLKDLL and a falling clock signal FCLKDLL. The pre-driver 30 is configured to output data driving signals according to output signals of the clock controller 40.

The clock controller 40 includes a pulse generator 10 and a clock regulator 20. The pulse generator 10 is configured to vary pulse widths of the rising clock signal RCLKDLL and the falling clock signal FCLKDLL. The clock regulator 20 is configured to regulate output signals of the pulse generator 10 to prevent an overlap and a duty drop of the output signals of the pulse generator 10. Circuit configurations of the pulse generator 10, the clock regulator 20 and the pre-driver 30 are the same as described above with reference to FIGS. 7, 8 and 9, and therefore detailed descriptions thereof, in the interest of brevity, will not be repeated infra.

Figure 12:
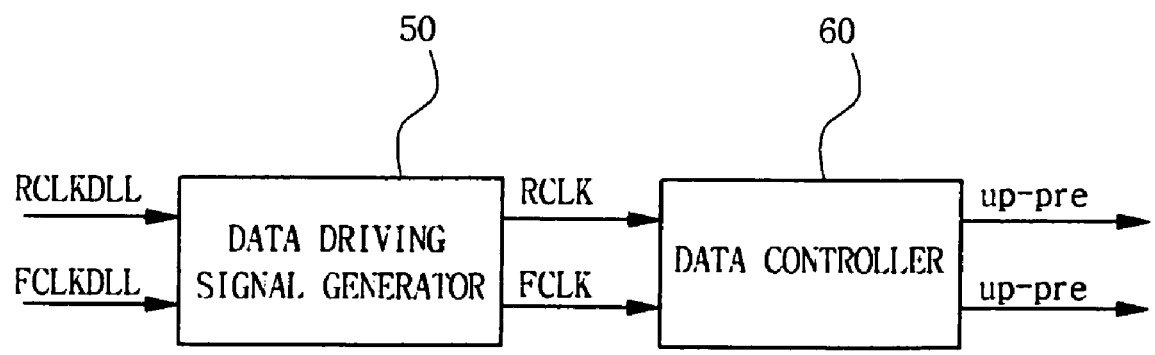
FIG. 12 illustrates a block diagram of a clock pulse generating circuit according to another exemplary embodiment of the present disclosure.
Figure 13:
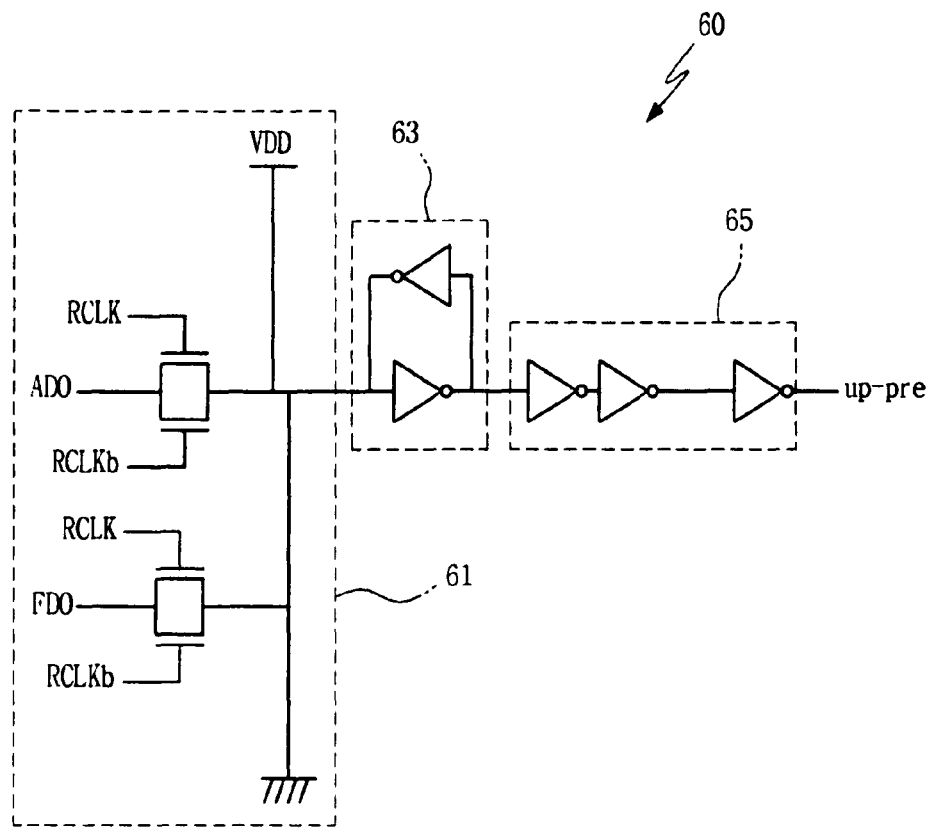
FIG. 13 illustrates a circuit diagram of a data controller in the clock pulse generating circuit shown in FIG. 12.
Figure 13:
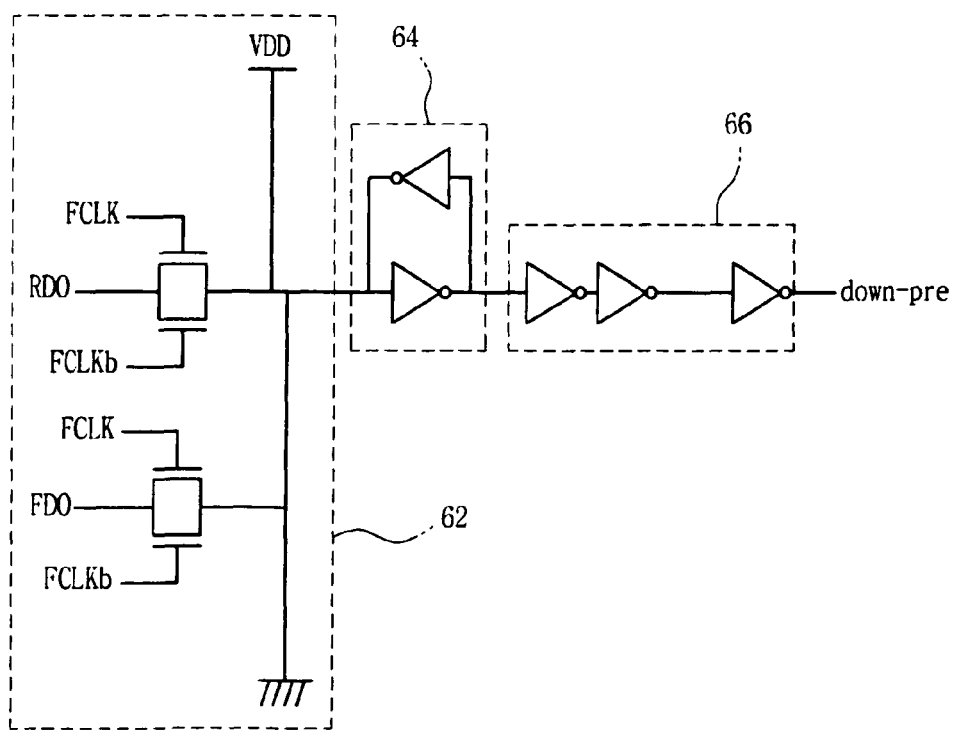

FIG. 12 illustrates a block diagram of a clock pulse generating circuit according to another exemplary embodiment of the present disclosure, and FIG. 13 illustrates a circuit diagram of a data controller in the clock pulse generating circuit of FIG. 12.

Referring to FIG. 12, the clock pulse generating circuit includes a data driving signal generator 50 and a data controller 60. The data driving signal generator 50 is configured to regulate a rising clock signal RCLKDLL and a falling clock signal FCLKDLL to output data driving signals RCLK and FCLK. The data controller 60 is configured to control input data signals in response to the data driving signals RCLK and FCLK.

The data driving signal generator 50 includes a clock controller 40 configured to regulate the clock signals and a pre-driver 30 configured to output the data driving signals according to output signals of the clock controller 40.

The clock controller 40 includes a pulse generator 10 and a clock regulator 20. The pulse generator 10 is configured to vary pulse widths of a rising clock signal RCLKDLL and a falling clock signal FCLKDLL. The clock regulator 20 is configured to regulate output signals of the pulse generator 10 to prevent an overlap and a duty drop of the output signals of the pulse generator 10. Circuit configurations of the pulse generator 10, the clock regulator 20 and the pre-driver 30 are the same as described above with reference to FIGS. 7, 8 and 9, and therefore detail descriptions thereof will not be repeated infra.

Referring to FIG. 13, the data controller 60 includes a signal transfer unit 61 and 62, a latch unit 63 and 64 and a buffer unit 65 and 66. The signal transfer units 61 and 62 are configured to transfer input data signals RDO and FDO in response to the data driving signals RCLK and FCLK. The latch units 63 and 64 are configured to latch respective output signals of the signal transfer units 61 and 62. The buffer units 65 and 66 are configured to buffer output signals of the latch units 63 and 64, and output signals up-pre and down-pre, respectively, as data signals.

Figure 10:
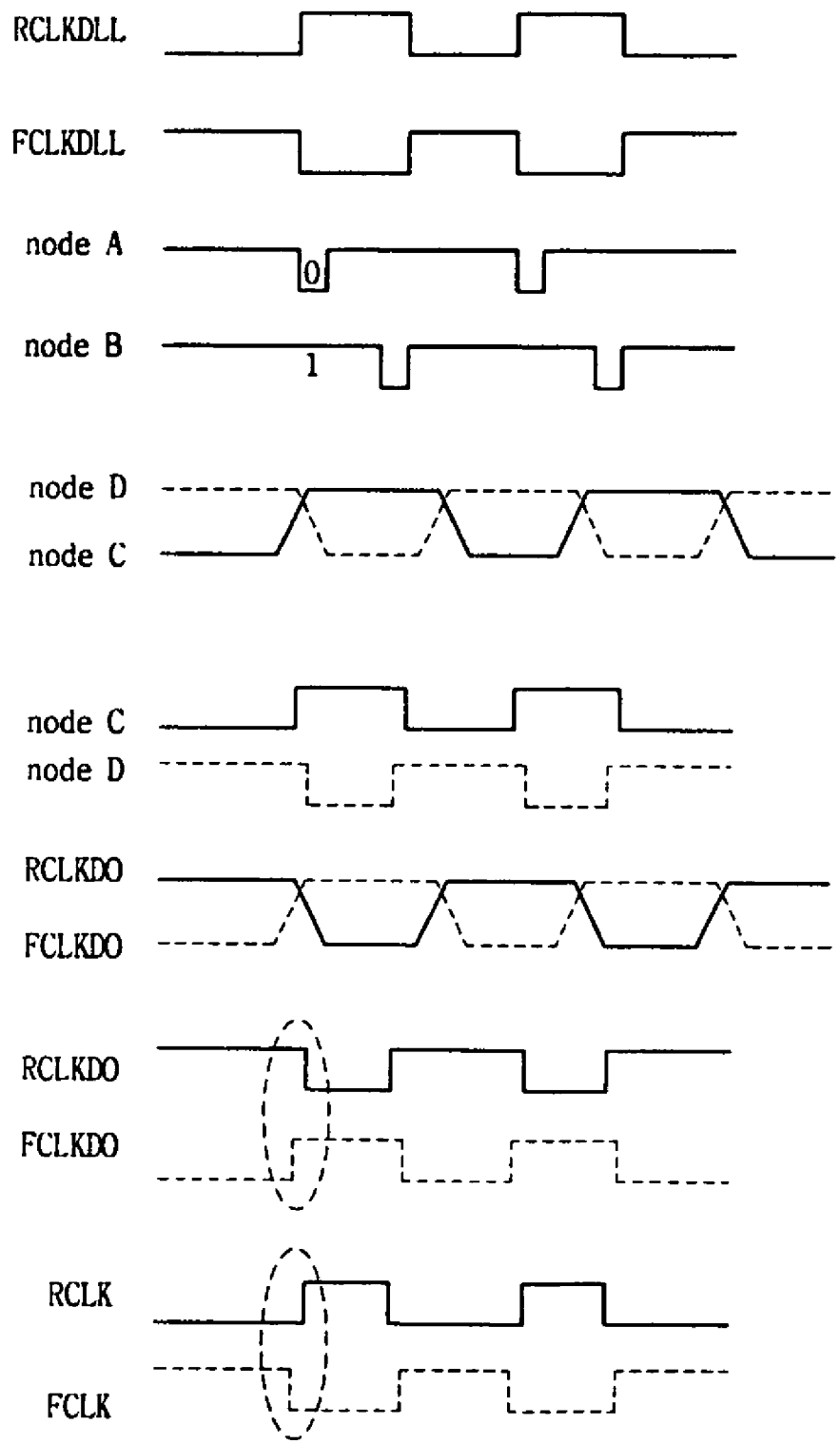
FIG. 10 illustrates an operation timing diagram of a clock pulse generating circuit according to an exemplary embodiment of the present disclosure.

Hereinafter, an operation of a clock pulse generating circuit according to exemplary embodiments of the present disclosure will be described with reference to the accompanying drawings. FIG. 10 illustrates an operation timing diagram of a clock pulse generating circuit according to an exemplary embodiment of the present disclosure.

To begin with, referring to FIGS. 7 and 10, a pulse generator 10 varies pulse widths of a rising clock signal RCLKDLL and a falling clock signal FCLKDLL. Specifically, a first delay unit 111 delays the rising clock signal RCLKDLL, and a first logic unit 112 performs a logic operation on the rising clock signal RCLKDLL and an output signal of the first delay unit. The resultant signal is shown as an A node signal in FIG. 10. A second delay unit 121 delays the falling clock signal FCLKDLL, and a second logic unit 122 performs a logic operation on the falling clock signal FCLKDLL and an output signal of the first delay unit. The resultant signal is shown as a B node signal in FIG. 10.

Thereafter, referring to FIGS. 8 and 10, a clock regulator 20 regulates the A node signal and the B node signal output from the pulse generator 10 by using an SR latch circuit. Specifically, a first logic unit 211 performs a logic operation on the A node signal and a second logic unit 212 performs a logic operation on the B node signal. An output signal of the first logic unit 211 is input into the second logic unit 212 and an output signal of the second logic unit 212 is input into the first logic unit 211. The resultant signals are shown as a C node signal and a D node signal in FIG. 10.

Then, a third logic unit 221 performs a logic operation on the C node signal and a fourth logic unit 222 performs a logic operation on the D node signal. An output signal of the third logic unit 221 is input into the fourth logic unit 222 and an output signal of the fourth logic unit 222 is input into the third logic unit 221. The resultant signals are shown as signals RCLKDO and FCLKDO in FIG. 10.

Afterward, referring to FIGS. 9 and 10, a pre-driver 30 inverts the signals RCLKDO and FCLKDO output from the clock regulator 20 by using an inverter 32. The resultant signals are shown as signals RCLK and FCLK in FIG. 10.

After that, referring to FIG. 13, a data controller synchronizes input data signals RDO and FDO with the data driving signals RCLK and FCLK, to transfer the synchronized data signals to DQ drivers (not shown). That is, the data controller 60 outputs the data signals RDO and FDO input from signal transfer units 61 and 62 to the DQ drivers in response to the data driving signals RCLK and FCLK output from the pre-driver 30.

The clock pulse generating circuit according to the exemplary embodiments of the present disclosure can prevent clock pulse signals, which data signals will be synchronized with, from overlapping each other by modifying circuits of a pulse generator and a pre-driver. Further, the clock pulse generating circuit according to the exemplary embodiments of the present disclosure can stabilize the supply of clock pulse signals even if a skew is generated to prevent deteriorations of characteristics such as tAC and tDQSK.

While the subject matter of the present disclosure has been described with respect to examples and exemplary embodiments, it will be apparent to those skilled in the art that various changes and modifications may be made without departing from the spirit and scope of the invention as defined in the following claims.

The present application claims priority to Korean patent application number 10-2007-85153, filed on Aug. 23, 2007, the entire contents of which are incorporated herein by reference.

What is claimed is:

1. A clock pulse generating circuit comprising:
    a pulse generator configured to vary a first pulse width of a rising clock signal and a second pulse width of a falling clock signal;
    a clock regulator configured to regulate output signals of the pulse generator to prevent an overlap and a duty drop of the output signals of the pulse generator;
    a pre-driver configured to output data driving signals according to output signals of the clock regulator; and
    a data controller configured to control input data signals in response to the data driving signals.

2. The clock pulse generating circuit of claim 1, wherein the pulse generator comprises:
    a first variation part configured to vary said first pulse width of the rising clock signal; and
    a second variation part configured to vary said second pulse width of the falling clock signal.

3. The clock pulse generating circuit of claim 2, wherein the first variation part comprises:
    a first delay unit configured to delay the rising clock signal by a predetermined time; and
    a first logic unit configured to perform a logic operation on the rising clock signal and an output signal of the first delay unit.

4. The clock pulse generating circuit of claim 2, wherein the second variation part comprises:

a second delay unit configured to delay the falling clock signal by a predetermined time; and a second logic unit configured to perform a logic operation on the falling clock signal and an output signal of the second delay unit.

5. The clock pulse generating circuit of claim 1, wherein the clock regulator comprises:

a first regulation part configured to regulate a first clock signal and a second clock signal output from the pulse generator by using an SR latch circuit; and a second regulation part configured to regulate output signals of the first regulation part by using an SR latch circuit.

6. The clock pulse generating circuit of claim 5, wherein the first clock signal is generated by varying said first pulse width of the rising clock signal, and the second clock signal is generated by varying said second pulse width of the falling clock signal.

7. The clock pulse generating circuit of claim 5, wherein the first regulation part comprises:

a first logic unit configured to perform a logic operation on the first clock signal; and a second logic unit configured to perform a logic operation on the second clock signal, an output signal of the first logic unit being input into the second logic unit, an output signal of the second logic unit being input into the first logic unit.

8. The clock pulse generating circuit of claim 7, wherein the second regulation part comprises:

a third logic unit configured to perform a logic operation on an output signal of the first logic unit; and a fourth logic unit configured to perform a logic operation on an output signal of the second logic unit, an output signal of the third logic unit being input into the fourth logic unit, an output signal of the fourth logic unit being input into the third logic unit.

9. The clock pulse generating circuit of claim 1, wherein the pre-driver comprises an inverter unit configured to invert the output signals of the clock regulator.

10. The clock pulse generating circuit of claim 9, wherein the pre-driver further comprises a buffer unit configured to buffer the output signals of the clock regulator.

11. The clock pulse generating circuit of claim 1, wherein the data controller comprises a signal transfer unit configured to transfer input data signals in response to the data driving signals.

12. The clock pulse generating circuit of claim 11, wherein the data controller further comprises:

a latch unit configured to latch output signals of the signal transfer unit; and a buffer unit configured to buffer output signals of the latch unit.

* * * * *